United States Patent
Suh et al.

(10) Patent No.: US 7,177,216 B2
(45) Date of Patent: Feb. 13, 2007

(54) TWIN-CELL BIT LINE SENSING CONFIGURATION

(75) Inventors: Jungwon Suh, Apex, NC (US); Jong-Hoon Oh, Chapel Hill, NC (US)

(73) Assignee: Infineon Technologies AG, Munich (DE)

( * ) Notice: Subject to any disclaimer, the term of this patent is extended or adjusted under 35 U.S.C. 154(b) by 79 days.

(21) Appl. No.: 10/992,826

(22) Filed: Nov. 19, 2004

(65) Prior Publication Data

US 2006/0109731 A1    May 25, 2006

(51) Int. Cl.
*G11C 7/00*    (2006.01)
(52) U.S. Cl. ..................... 365/205; 365/190
(58) Field of Classification Search ............... 365/205, 365/190
See application file for complete search history.

(56) References Cited

U.S. PATENT DOCUMENTS

| | | | |
|---|---|---|---|
| 6,754,746 B1* | 6/2004 | Leung et al. ............... 710/100 |
| 6,898,110 B2* | 5/2005 | Ishimatsu et al. ........... 365/149 |
| 6,914,837 B2* | 7/2005 | Schroeder et al. .......... 365/205 |
| 6,947,344 B2* | 9/2005 | Suh ............................. 365/205 |
| 2002/0057601 A1* | 5/2002 | Sakamoto et al. .......... 365/190 |
| 2002/0141228 A1 | 10/2002 | Fujino |
| 2004/0017705 A1* | 1/2004 | Hasegawa et al. .......... 365/200 |
| 2004/0170075 A1* | 9/2004 | Suh ............................. 365/205 |

OTHER PUBLICATIONS

PCT International Search Report and Written Opinion dated Mar. 23, 2006 for PCT/EP2005/012335.

* cited by examiner

*Primary Examiner*—Michael Tran
(74) *Attorney, Agent, or Firm*—Patterson & Sheridan, L.L.P.

(57) ABSTRACT

Twin-cell bit line sensing structures and techniques are provided. Utilizing a folded bit line like structure, with bit line and complementary bit lines located together, sense amplifiers can be between cell arrays. Bit line switches, responsive to activated word lines in an array, may be used to selectively couple bit line pairs of the shared arrays with the sense amplifiers with a single word line activation.

16 Claims, 4 Drawing Sheets

TWIN-CELL BIT LINE SENSING CONFIGURATION

BACKGROUND OF THE INVENTION

1. Field of the Invention

The invention generally relates to memory devices and, more particularly, to memory devices having memory cells arranged in a twin-cell array structure.

2. Description of the Related Art

The evolution of sub-micron CMOS technology has resulted in an increasing demand for high-speed semiconductor memory devices, such as dynamic random access memory (DRAM) devices, pseudo static random access memory (PSRAM) devices, and the like. Herein, such memory devices are collectively referred to as DRAM devices. Such devices utilize memory cells consisting of one transistor and one capacitor. Due to leakage, the memory cells require periodic refreshing to protect data that is stored in the memory cell from corruption or decaying over time. The data stored in the memory cell is automatically restored to a full logic level when accessed (e.g., via a read or write operation), but must be periodically refreshed when not accessed. Therefore, DRAM devices typically include refresh circuitry to facilitate memory cell refresh.

Because each row of cells must be accessed within a specified cell retention time, refresh operations occur frequently. As a result, refreshing memory cells is a power-consuming routine. In battery-powered computer systems (e.g., palm-top computers, cellular telephones, and other portable electronic devices), minimization of power consumption is critically important. In general, as the cell data retention time increases, the self refresh current decreases.

One approach that may reduce the power consumption of memory by increasing cell retention time is to arrange memory cells in what is known in the art as a twin-cell array structure. Twin-cell array structures, as the name implies, utilize two memory cells to store a single bit of information which inherently increases data retention time as more charge is used to store each bit. Complementary logic levels are stored in the two cells which, when accessed, are connected to differential inputs of a sense amplifier. By utilizing the same type of memory cells in twin-cell structures as in single-cell structures, data retention time can be increased without significant manufacturing process changes.

FIG. 1 shows a conventional twin-cell array structure 100, utilizing what is referred to as an open bit cell arrangement with sense amplifiers 104 arranged between arrays 110 of memory cells 107. In the illustrated scheme, two word lines, $102_U$ and $102_L$, are activated simultaneously. This activation couples two adjacent memory cells $107_U$ and $107_L$ to one of differential inputs of the sense amplifier 104 via bit lines 103 and a single bit of data is written to or read from the two cells. Because DRAM cells store data as charge at each cell capacitor, if the stored charge for a single data bit is doubled, the data retention time can be easily extended without any process changes.

Unfortunately, this open bit line twin-cell structure has several problems. One problem arises because this structure requires dummy cell arrays 120A and 120B to provide reference signals for edge bit line sense amplifier arrays 130A and 130B. These dummy cell arrays include unused memory cells 124 that usually can not be used for storing data, so these cells result in chip size penalty. Another problem is that the simultaneous activation of two word lines, with a boosted word line voltage level, results in much more power consumption than conventional single word line activations. Still another problem is that capacitive loading difference between a bit line 103 (e.g., in an upper array) and a complementary bit line 103 (e.g., in a lower array) may be significant. When accessing two cells, they are connected only to a bit line. The capacitance loading difference may result in a larger offset voltage at the bit line sense amplifier, thus reducing the sensing margin.

Accordingly, there is a need for an improved sensing technique and twin-cell array structure.

SUMMARY OF THE INVENTION

Embodiments of the invention generally provide structures, devices, and techniques utilizing twin-cell bit sensing structures.

One embodiment provides an array structure. The array structure generally includes at least first and second memory cell arrays, each having memory cells formed at intersections between word lines and bit lines and at least a first sense amplifier array formed between the at least first and second memory cell arrays. The first sense amplifier array generally includes, for each sense amplifier in the array, a first pair of switches to selectively couple complementary pairs of bit lines of the first memory cell array to inputs of the sense amplifier, in response to activation of a word line in the first memory cell array, and a second pair of switches to selectively couple complementary pairs of bit lines of the second memory cell array to inputs of the sense amplifier, in response to activation of a word line in the second memory cell array.

Another embodiment provides another array structure. The array structure generally includes a plurality of memory cell arrays, each having memory cells formed at intersections between word lines and bit lines and a plurality of sense amplifier arrays, each formed between a pair of the plurality of memory cell arrays. Each sense amplifier generally includes, for each sense amplifier in the array, a first pair of switches to selectively couple complementary pairs of bit lines of a first of the surrounding pair of memory cell arrays to inputs of the sense amplifier, in response to activation of a word line in the first of the surrounding pair of memory cell arrays, and a second pair of switches to selectively couple complementary pairs of bit lines of a second of the surrounding pair of memory cell arrays to inputs of the sense amplifier, in response to activation of a word line in the second of the surrounding pair of memory cell arrays. The structure further includes first and second edge sense amplifier arrays surrounding the plurality of memory cell arrays, wherein bit lines of outer most of the plurality of memory cell arrays are coupled to inputs of sense amplifiers in the edge sense amplifier arrays.

Another embodiment provides a memory device. The memory device generally includes at least first and second memory cell arrays, each having memory cells formed at intersections between word lines and bit lines, and at least a first sense amplifier array formed between the at least first and second memory cell arrays. The first sense amplifier array generally includes, for each sense amplifier in the array, a first pair of switches to selectively couple complementary pairs of bit lines of the first memory cell array to inputs of the sense amplifier, in response to activation of a word line in the first memory cell array, and a second pair of switches to selectively couple complementary pairs of bit lines of the second memory cell array to inputs of the sense amplifier, in response to activation of a word line in the second memory cell array. The memory device further includes interface circuitry coupled with the first sense amplifier array for reading data from and writing data to the first and second memory arrays.

Another embodiment provides a method for manufacturing a memory device. The method generally includes forming at least first and second memory cell arrays, with memory cells formed at intersections between word lines and bit lines and forming at least a first sense amplifier array between the at least first and second memory cell arrays. The method also includes forming, for each sense amplifier in the array, a first pair of switches to selectively couple complementary pairs of bit lines of the first memory cell array to inputs of the sense amplifier, in response to activation of a word line in the first memory cell array, and a second pair of switches to selectively couple complementary pairs of bit lines of the second memory cell array to inputs of the sense amplifier, in response to activation of a word line in the second memory cell array.

Another embodiment provides a method of accessing data. The method generally includes activating a first wordline in a first memory cell array to select a pair of complementary memory cells formed at intersections of a first pair of complementary bit lines of the first memory cell array and the first wordline, closing a first pair of switches, in response to activating the first word line, to couple the first pair of complementary bit lines to inputs of a sense amplifier, subsequently, activating a second wordline in a second memory cell array to select a pair of complementary memory cells formed at intersections of a second pair of complementary bit lines of the second memory cell array and the second wordline, and closing a second pair of switches, in response to activating the second word line, to couple the second pair of complementary bit lines to inputs of the sense amplifier.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide twin-cell bit line sensing structures and techniques. With bit line and complementary bit lines located together, as in a folded bit line cell array, sense amplifiers can be positioned between cell arrays. Bit line switches, responsive to activated word lines in an array, may be used to selectively couple bit line pairs of the shared arrays with the sense amplifiers. As a result, the number of sense amplifiers shared between cell arrays may be reduced (e.g., halved), resulting in reduced chip size. In this configuration, edge bit line sense amplifier arrays do not require dummy cell arrays, allowing further reductions in chip size. Further, a single word line activation may couple bit line pairs to the sense amplifiers, significantly reducing power consumption.

An Exemplary Twin-Cell Array Structure

Figure 2:
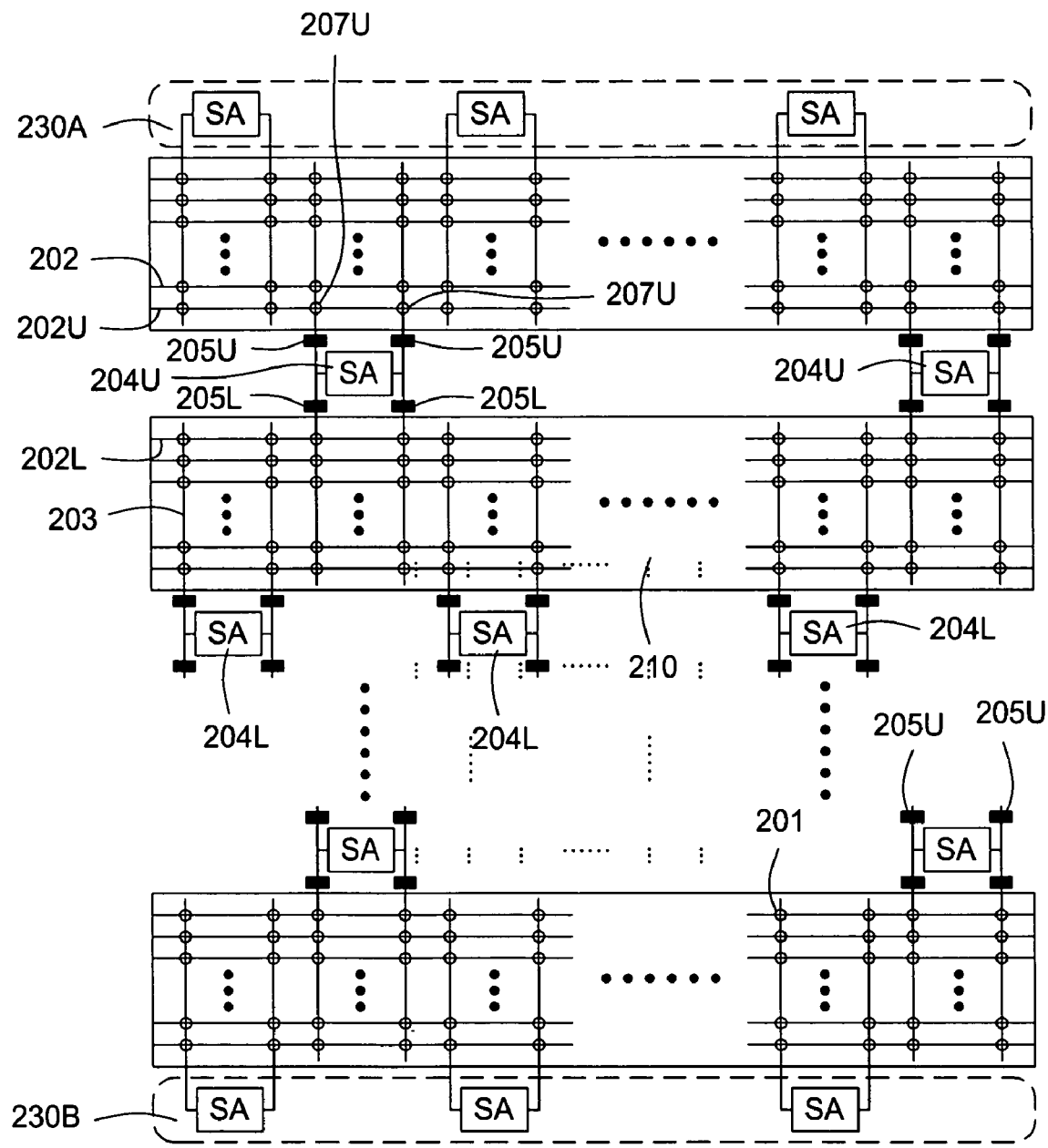
FIG. 2 illustrates an exemplary twin-cell array structure, in accordance with one embodiment of the present invention.

FIG. 2 shows a twin-cell array structure 200, utilizing an arrangement similar to what is commonly referred to as a folded bit cell arrangement. Arrays of sense amplifiers 204 may be arranged between arrays 210 of memory cells 207. In the illustrated scheme, a single word line 202 is activated to couple two complementary memory cells 207 to a sense amplifier 204.

For example, activation of a single word line $202_U$ in an upper array may couple a complimentary bit line pair $207_U$ to a sense amplifier $204_U$. As illustrated, the sense amplifier $204_U$ may be coupled with bit line pairs in arrays above and below the sense amplifier $204_U$. Bit line switches 205 may be used to couple the appropriate bit lines to the sense amplifiers during sensing operations. For example, in response to activation of the upper word line $202_U$, upper switches $205_U$ may close to couple memory cells $207_U$ to the sense amplifier $204_U$, while lower switches $205_L$ remain open to isolate memory cells $207_L$ in a lower array.

In other words, the bit line switches 205 operate according to the location (in which array) of an activated word line 202. For some embodiments, all switches 205 may open during a precharge state, and only those switches (upper and lower) for sense amplifiers 204 coupled with an array in which an activated word line is located, are closed, thereby coupling those corresponding sense amplifiers 204 to the cell array. The switches 205 may be any suitable type switches, such as NMOS transistors, responsive to a corresponding word line activation. For other embodiments, all switches 205 may close during a precharge state, and only those switches (upper and lower) for sense amplifiers 204 coupled with an array in which an activated word line is located, are closed, thereby coupling those corresponding sense amplifiers 204 to the cell array.

Figure 3:
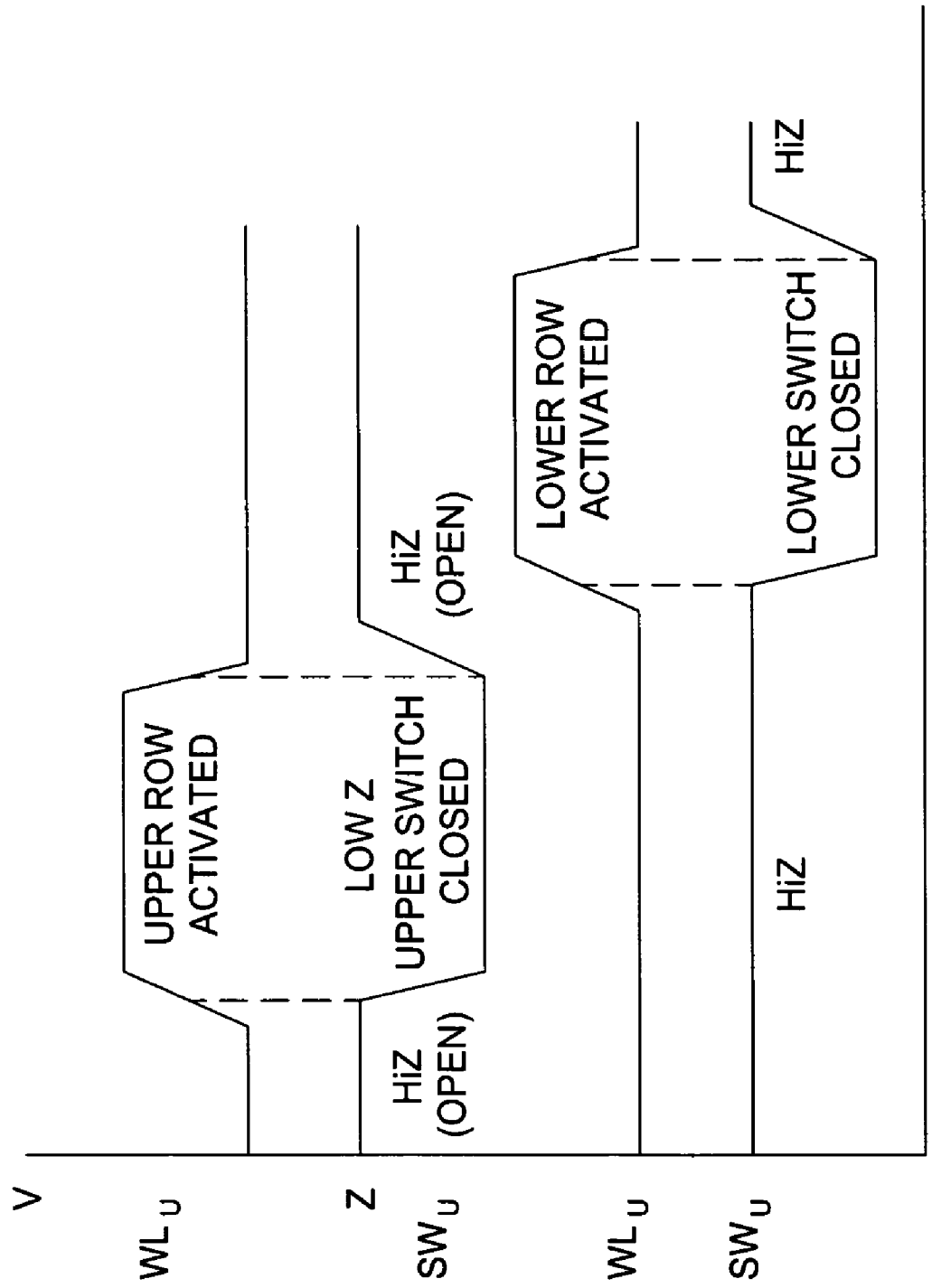
FIG. 3 illustrates an exemplary timing diagram for bit line switches, in accordance with one embodiment of the present invention.

Operation of switches 205 may be described with reference to FIG. 3, which illustrates an exemplary timing diagram for bit line switches 205 for an array of sense amplifiers $204_U$, in accordance with one embodiment of the present invention. As illustrated, before activation of a wordline $202_U$ above the array of sense amplifiers $204_U$ (e.g., following a precharge period), upper switches $205_U$ may be open, (the upper switch impedance $SW_U$ is shown in a high impedance HiZ state). In response to activation of the wordline $202_U$, the upper switches $205_U$ may be closed (changing to a low impedance "LowZ" state), coupling complementary pairs of bit lines 203 in the upper array to the sense amplifiers $204_L$.

As illustrated, once the wordline $202_U$ is de-activated, the upper switches $205_U$ return to open, decoupling bit lines from the upper memory cell array from the array of sense amplifiers $204_U$. In response to subsequent activation of a wordline $202_L$, in a cell array below the array of sense amplifiers $204_U$, the lower switches $205_L$ may be closed, coupling complementary pairs of memory cells $207_L$ in the lower array to the sense amplifiers $204_U$. Once the wordline $202_L$ is de-activated, the lower switches $205_L$ return to open.

It should be noted that, in the arrangement illustrated in FIG. 2, complementary bit line pairs from a memory cell array with an activated word line 202 may be coupled to sense amplifiers located both above and below the memory cell array. For example, as described above, in response to activation of a lower wordline $202_L$ in a cell array, lower switches $205_L$ for an array of upper sense amplifiers $204_U$ (above the cell array) may be closed to couple bit lines of the array to the upper sense amplifiers $204_U$. Simultaneously, upper switches $205_U$ for an array of lower sense amplifiers $204_L$ (below the cell array) may be closed to couple bit lines of the array to the lower sense amplifiers $204_U$.

Figure 1:
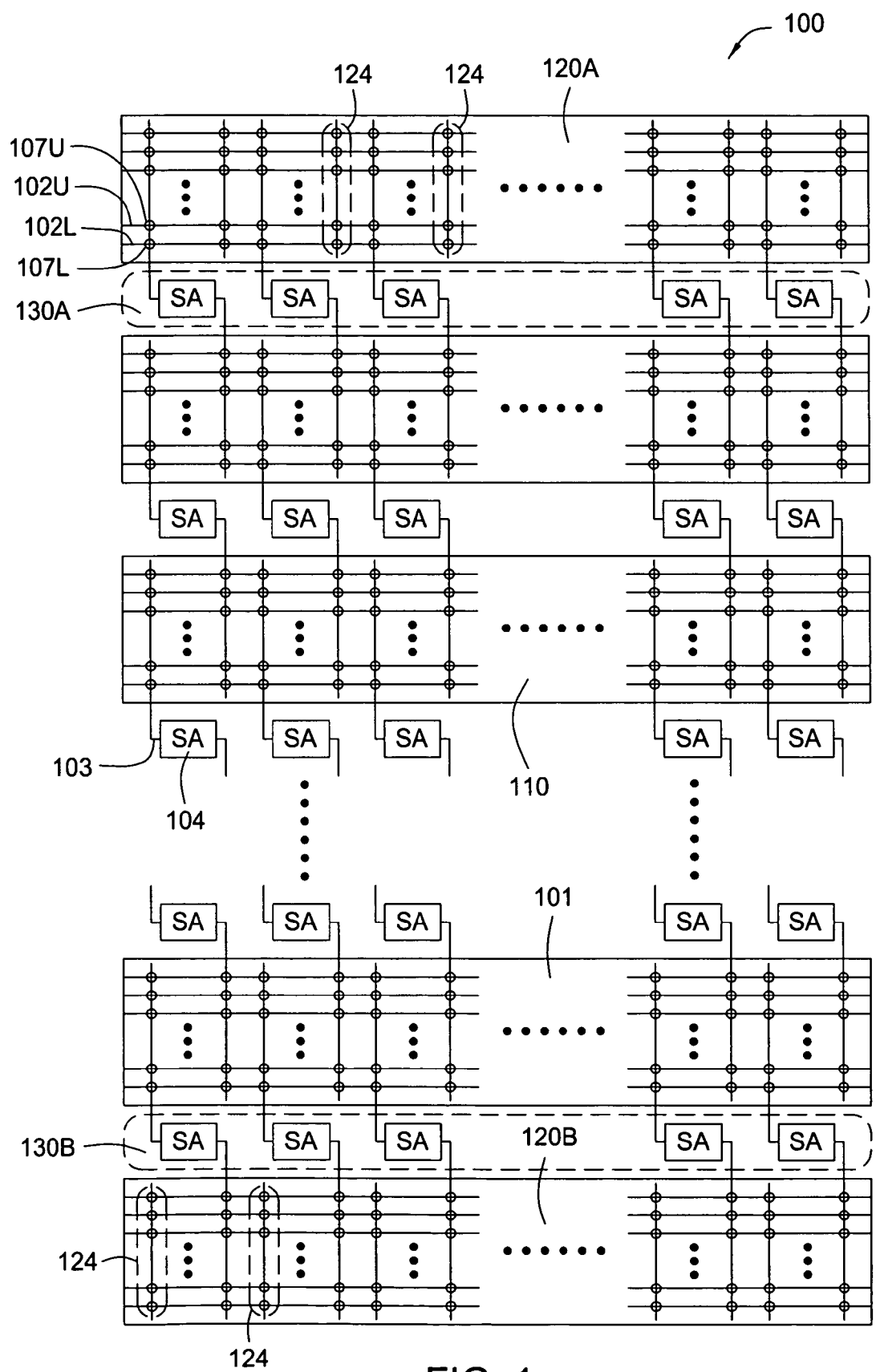
FIG. 1 illustrates a conventional twin-cell array structure.

Compared to prior art structures, such as that illustrated in FIG. 1, the total number of bit line sense amplifiers 204 located between each array is reduced (in the illustrated embodiment, the number is reduced by one half). Therefore, these bit line sense amplifier arrays occupy smaller chip area and more cost-effective memory devices can be manufactured.

Further, edge bit line sense amplifier arrays 230A and 230B do not require dummy cell arrays (e.g., such as dummy cell arrays 120A and 120B shown in FIG. 1), because each edge sense amplifier 204A–204B has a bit line configuration similar to a folded bit line. As a result, further reductions in chip area may be achieved. It should also be noted that edge bit line sense amplifier arrays 230A and 230B do not require bit line switches for bit line selection/isolation, as they are coupled to only one memory cell array.

According to the arrangement described herein, a single word line is activated to access a pair of cells simultaneously, with one cell connected to a bit line and another cell connected to a complementary bit line. This single word line activation reduces power when compared to conventional dual word line activation utilized in conventional twin-cell sensing schemes. Further, by locating complementary bit line pairs near each other (e.g., on adjacent bit lines sharing a common word line), capacitance loading between bit lines is made essentially the same. As a result, better sensing margins may be guaranteed.

An Exemplary Memory Device

Figure 4:
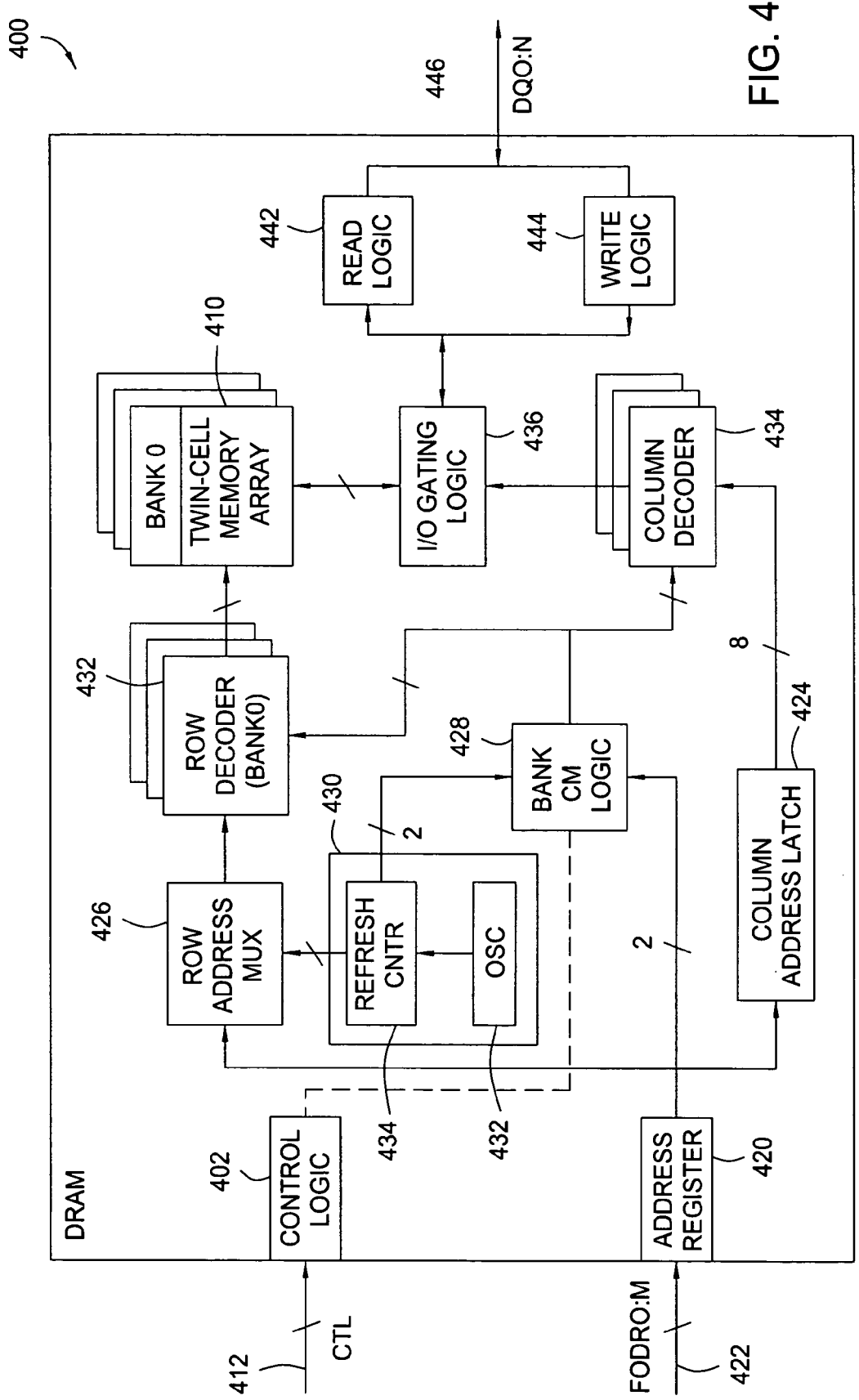
FIG. 4 illustrates an exemplary memory device utilizing twin-cell array structures, in accordance with one embodiment of the present invention.

FIG. 4 illustrates an exemplary memory device 400 (e.g., a DRAM device) utilizing twin-cell array structures 410, in accordance with one embodiment of the present invention. The twin-cell array structure may include arrays of memory cells and sense line amplifiers, arranged as described above.

As illustrated, the device 400 may include control logic 402 to receive a set of control signals 412 to access data stored in the array structures 410 at locations specified by a set of address signals 422. The address signals 422 may be latched into an address register 422 in response to signals 412. Row address mux circuitry 426 and decoder circuitry 432 may convert a latched address into a row number used to activate one of the array structures 410 (selected by bank control logic 428). Column address latch circuitry 424 and decoder circuitry 434 may convert the latched address into column select signals used by I/O gating logic 436. The I/O gating logic 436 is used to access the sense amplifiers of the array structures 410 to write data provided by data signals 446 via write logic 444 thereto, or to read data via read logic 442 therefrom.

As illustrated, the device 400 may include refresh circuitry 430 to generate signals to refresh cells in the array structures 410, in an effort to avoid the loss of data therefrom. In a self-refresh state, these signals may be generated by a refresh counter 434 driven by an oscillator 432. The frequency of the oscillator is chosen in an effort to ensure each row of memory cells is refreshed at least once within its specified retention time.

In many battery-powered portable devices, refreshing memory cells results in a significant amount of total current consumption. Utilizing the twin-cell memory cell sensing array structures 410 described herein, data retention time may be increased and the self-refresh frequency may be reduced (e.g., by lowering the frequency of oscillator 432), thereby reducing the overall current consumption of the device, while still achieving a compact, space-efficient design.

By utilizing a folded bit line like structure, with bit line and complementary bit lines located together, embodiments of the present invention provide space-efficient memory array sensing structures. Further, by accessing complementary bit line pairs with a single word line activation, overall power consumption of each sensing operation may be significantly reduced.

While the foregoing is directed to embodiments of the present invention, other and further embodiments of the invention may be devised without departing from the basic scope thereof, and the scope thereof is determined by the claims that follow.

What is claimed is:

1. An array structure, comprising:
   at least first and second memory cell arrays, each having memory cells formed at intersections between word lines and bit lines;
   at least a first sense amplifier array formed between the at least first and second memory cell arrays, the first sense amplifier array comprising, for each sense amplifier in the array,
      a first pair of switches to selectively couple complementary pairs of bit lines of the first memory cell array to inputs of the sense amplifier, in response to activation of a word line in the first memory cell array, and
      a second pair of switches to selectively couple complementary pairs of bit lines of the second memory cell array to inputs of the sense amplifier, in response to activation of a word line in the second memory cell array; and
   at least a first edge sense amplifier array outside the first memory cell array, wherein complementary pairs of bit lines of the first memory cell array are coupled to inputs of sense amplifiers in the edge sense amplifier array without being isolated by a switch regardless of whether or not a word line in the first memory cell array is activated.

2. The structure of claim 1, wherein:
   the first pair of switches, for each sense amplifier, is configured to isolate bit lines of the first memory cell array from the sense amplifier when no word line in the first memory cell array is activated; and
   the second pair of switches, for each sense amplifier, is configured to isolate bit lines of the second memory cell array from the sense amplifier when no word line in the second memory cell array is activated.

3. The structure of claim 1, wherein the first and second pairs of switches are formed using NMOS transistors.

4. The structure of claim 1, wherein complementary pairs of bit lines of the first memory cell array are alternately coupled to:
   inputs of sense amplifiers in the edge sense amplifier array; and first pairs of switches of sense amplifiers in the first sense amplifier array.

5. The structure of claim 1, further comprising:
at least a third memory cell array, with memory cells formed at intersections between word lines and bit lines; and
at least a second sense amplifier array formed between the second and third memory cell arrays;
wherein complementary pairs of bit lines of the second memory cell array are alternatively coupled to switches of sense amplifiers in the first and second sense amplifier arrays.

6. An array structure, comprising:
a plurality of memory cell arrays, each having memory cells formed at intersections between word lines and bit lines;
a plurality of sense amplifier arrays, each formed between a pair of the plurality of memory cell arrays, each sense amplifier array comprising, for each sense amplifier in the array,
 a first pair of switches to selectively couple complementary pairs of bit lines of a first of the surrounding pair of memory cell arrays to inputs of the sense amplifier, in response to activation of a word line in the first of the surrounding pair of memory cell arrays, and
 a second pair of switches to selectively couple complementary pairs of bit lines of a second of the surrounding pair of memory cell arrays to inputs of the sense amplifier, in response to activation of a word line in the second of the surrounding pair of memory cell arrays; and
first and second edge sense amplifier arrays surrounding the plurality of memory cell arrays, wherein bit lines of outer most of the plurality of memory cell arrays are coupled to inputs of sense amplifiers in the edge sense amplifier arrays without being isolated by a switch, regardless of whether a word line in the outer most memory cell arrays is activated.

7. The structure of claim 6, wherein complimentary bit line pairs in each memory cell array are alternatively coupled to different sense amplifier arrays surrounding the memory cell array.

8. The structure of claim 7, wherein bit lines of outer most of the plurality of memory cell arrays are coupled to inputs of sense amplifiers in the edge sense amplifier arrays regardless of whether or not word lines of the outermost of the plurality of memory cell arrays are activated.

9. The structure of claim 6, wherein the first and second pairs of switches are formed utilizing NMOS transistors.

10. A memory device, comprising:
at least first and second memory cell arrays, each having memory cells formed at intersections between word lines and bit lines;
at least a first sense amplifier array formed between the at least first and second memory cell arrays, the first sense amplifier array comprising, for each sense amplifier in the array,
 a first pair of switches to selectively couple complementary pairs of bit lines of the first memory cell array to inputs of the sense amplifier, in response to activation of a word line in the first memory cell array, and
 a second pair of switches to selectively couple complementary pairs of bit lines of the second memory cell array to inputs of the sense amplifier, in response to activation of a word line in the second memory cell array; and
interface circuitry coupled with the first sense amplifier array for reading data from and writing data to the first and second memory arrays wherein the interface circuitry is configured to:
 activate a first wordline in the first memory cell array to couple complementary pairs of bit lines from the first memory cell array to inputs of sense amplifiers in the first sense amplifier array, via the first set of switches, to read bits of data stored therein or write bits of data thereto; and
 subsequently, activate a second wordline in the second memory cell array to couple complementary pairs of bit lines from the second memory cell array to inputs of sense amplifiers in the first sense amplifier array, via the second set of switches, to read bits of data stored therein or write bits of data thereto.

11. The memory device of claim 10, wherein:
the first pair of switches, for each sense amplifier, isolates a pair of complementary bit lines from the sense amplifier when a row in the first memory cell array is not activated; and
the second pair of switches, for each sense amplifier, isolates a pair of complementary bit lines from the sense amplifier when a row in the first memory cell array is not activated.

12. A method for manufacturing a memory device, comrprising:
forming at least first and second memory cell arrays, with memory cells formed at intersections between word lines and bit lines;
forming at least a first sense amplifier array between the at least first and second memory cell arrays;
forming, for each sense amplifier in the array,
 a first pair of switches to selectively couple complementary pairs of bit lines of the first memory cell array to inputs of the sense amplifier, in response to activation of a word line in the first memory cell array, and
 a second pair of switches to selectively couple complementary pairs of bit lines of the second memory cell array to inputs of the sense amplifier, in response to activation of a word line in the second memory cell; and
forming at least a first edge sense amplifier array outside the first memory cell array, wherein bit lines of the first memory cell array are coupled to inputs of sense amplifiers in the edge sense amplifier array without being isolated by a switch regardless of whether or not a word line in the first memory cell is activated.

13. The method of claim 12, wherein:
the first pair of switches, for each sense amplifier, is configured to isolate bit lines of the first memory cell array from the sense amplifier when no word line in the first memory cell array is activated; and
the second pair of switches, for each sense amplifier, is configured to isolate bit lines of the second memory cell array from the sense amplifier when no word line in the second memory cell array is activated.

14. The method of claim 12, wherein the first and second pairs of switches are formed using NMOS transistors.

15. The method of claim 12, further comprising:
forming at least a third memory cell array, with memory cells formed at intersections between word lines and bit lines; and forming at least a second sense amplifier array between the second and third memory cell arrays;

wherein complementary pairs of bit lines of the second memory cell array are alternatively coupled to switches of sense amplifiers in the first and second sense amplifier arrays.

16. A method of accessing data, comprising:

activating a first wordline in a first memory cell array to select a pair of complementary memory cells formed at intersections of a first pair of complementary bit lines of the first memory cell array and the first wordline;

closing a first pair of switches, in response to activating the first word line, to couple the first pair of complementary bit lines to inputs of a sense amplifier;

subsequently, activating a second wordline in a second memory cell array to select a pair of complementary memory cells formed at intersections of a second pair of complementary bit lines of the second memory cell array and the second wordline;

closing a second pair of switches, in response to activating the second word line, to couple the second pair of complementary bit lines to inputs of the sense amplifier; and opening the first pair of switches, in response to no word line in the first memory cell being activated, to isolate the first pair of complementary bit lines from inputs of the sense amplifier; and opening the second pair of switches, in response to no word line in the second memory cell being activated, to isolate the second pair of complementary bit lines from inputs of the sense amplifier.

* * * * *